United States Patent
Yang

(10) Patent No.: US 9,520,202 B1
(45) Date of Patent: Dec. 13, 2016

(54) PROGRAMMING VERIFICATION CONTROL CIRCUIT AND METHOD FOR CONTROL THEREOF

(71) Applicant: SHANGHAI HUAHONG GRACE SEMICONDUCTOR MANUFACTURING CORPORATION, Shanghai (CN)

(72) Inventor: Guangjun Yang, Shanghai (CN)

(73) Assignee: SHANGHAI HUAHONG GRACE SEMICONDUCTOR MANUFACTURING CORPORATION, Shanghai (CN)

( * ) Notice: Subject to any disclaimer, the term of this patent is extended or adjusted under 35 U.S.C. 154(b) by 0 days.

(21) Appl. No.: 14/976,704

(22) Filed: Dec. 21, 2015

(30) Foreign Application Priority Data

Jun. 7, 2015 (CN) .......................... 2015 1 0309118

(51) Int. Cl.
| G11C 11/34 | (2006.01) |
| G11C 16/34 | (2006.01) |
| G11C 16/08 | (2006.01) |
| G11C 16/10 | (2006.01) |

(52) U.S. Cl.
CPC ........... *G11C 16/3459* (2013.01); *G11C 16/08* (2013.01); *G11C 16/10* (2013.01)

(58) Field of Classification Search
CPC ...... G11C 16/3459; G11C 16/08; G11C 16/10
See application file for complete search history.

(56) References Cited

U.S. PATENT DOCUMENTS

| 2003/0179621 | A1* | 9/2003 | Kamei | ................... | G11C 16/08 365/200 |
| 2007/0047309 | A1* | 3/2007 | Satoh | ................ | G11C 16/0466 365/185.17 |

* cited by examiner

*Primary Examiner* — Richard Elms
*Assistant Examiner* — Mohammed A Bashar
(74) *Attorney, Agent, or Firm* — Muncy, Geissler, Olds & Lowe, P.C.

(57) ABSTRACT

A programming verification control circuit is disclosed, including: a first decoder circuit for decoding a word line of a memory bit; a first drive circuit for receiving a first voltage and providing the first voltage to the word line of the memory bit based on a decoding result of the first decoder circuit; a second decoder circuit for decoding a control gate of the memory bit; a second drive circuit for receiving a second voltage and providing the second voltage to the control gate of the first memory bit based on a decoding result of the second decoder circuit; and a voltage equalizer for receiving the first voltage, the second voltage and a first enable signal and, in event of the first enable signal being valid, controlling the first voltage and the second voltage to be conducted. A method for controlling the programming verification control circuit is also disclosed.

11 Claims, 7 Drawing Sheets

PROGRAMMING VERIFICATION CONTROL CIRCUIT AND METHOD FOR CONTROL THEREOF

CROSS-REFERENCES TO RELATED APPLICATIONS

This application claims the priority of Chinese patent application number 201510309118.7, filed on Jun. 7, 2015, the entire contents of which are incorporated herein by reference.

TECHNICAL FIELD

The present invention relates to verification of programming of a memory device and, in particular, to programming verification control circuits and methods for control thereof.

BACKGROUND

As a kind of integrated circuit (IC) memory devices, flash memories have the function of storing information in an electrically erasable and rewritable manner. For this reason, flash memories are widely used in electronic products including portable computers, cell phones and digital music players. A flash memory has many memory cells that are required to be so arranged as to be adapted to its operations. Each of the memory cells stores a single bit of data.

FIG. 1 schematically illustrates a memory cell of a conventional flash memory device, and FIG. 2 shows an array of memory cells of the conventional device. The flash memory device includes a plurality of the arrayed memory cells, as well as a plurality of bit lines (BL0, BL1, BL2, BL3, . . . , and BLm), a plurality of word lines (WL) and a plurality of control gates (e.g., CG0, CG1 and so forth), configured to select and provide drive signals to the individual memory cells. As shown in FIG. 1, each of the memory cells includes two memory bits, i.e., bits A and B, and a word line common to the two bits. Each of the memory bits includes a bit line and a control gate. While only two control gates are depicted in FIG. 2, i.e., CG0 and CG1, in practical, the memory may have more control gates (i.e., CG0, CG1, CG2, CG3, . . . , and CGn), as generally and commonly known in this art, and a detailed description thereof is therefore omitted herein.

Conventionally, in order to check whether a memory bit has been properly programmed, programming verification is generally carried out by reading the memory bit. This process is explained below with the programming of the memory bit A as an example. Typically, the memory bit A is programmed, concurrently with voltages of the control gate CG0, the word line WL and the control gate CG1 at 8.6 V, 1.5 V and 5V, respectively. In addition, after completion of the programming, the memory bit A is typically verified with the voltages of the control gate COO, the word line WL and the control gate CG1 at 0 V, 4.5 V and 5 V, respectively.

Referring to FIG. 3, in which the abscissa axis represents time t. The memory bit A is programmed at an instant t0, with the voltage of the control gate CG0 at 8.6 V and the voltage of the word line WL at 1.5 V. After the programming is completed at an instant t1, in order to enable the programming verification, it is needed to decrease the voltage on the control gate CG0 to 0 V and increase the voltage on the word line WL to 4.5V. However, due to latch-up and other effects, the decrease of the voltage at the control gate CG0 to 0 V takes a period of time $t_f$ and ends at an instant t2, which lead to elongation of the programming verification time. In addition, after the programming verification has ended at an instant t3, the voltage on the control gate CG0 is required to increase again to 8.6 V, with the voltage on the word line WL required to drop to 1.5 V, in order to allow the next programming cycle to start. Again, due to latch-up and other effects, the increase of the voltage on the control gate CG0 takes a period of time $t_r$ and ends at an instant t4. This makes an additional contribution to the elongation of the needed programming time.

SUMMARY OF THE INVENTION

It is therefore an objective of the present invention to provide a programming verification circuit and a method for control thereof, which can effectively reduce programming verification time and facilitate energy loss reduction.

In pursuit of this objective, the present invention provides a programming verification control circuit for controlling a programming verification sequence for a first memory bit of a memory cell. The programming verification control circuit includes:

a first decoder circuit for decoding a word line of the first memory bit;

a first drive circuit for receiving a first voltage and providing the first voltage to the word line of the first memory bit based on a decoding result of the first decoder circuit;

a second decoder circuit for decoding a first control gate of the first memory bit;

a second drive circuit for receiving a second voltage and providing the second voltage to the first control gate of the first memory bit based on a decoding result of the second decoder circuit; and a voltage equalizer for receiving the first voltage, the second voltage and a first enable signal and, in event of the first enable signal being valid, controlling the first voltage and the second voltage to be conducted.

Further, in the programming verification control circuit, in event of the first enable signal is invalid, the first memory bit performs a programming/programming verification operation.

Further, in the programming verification control circuit, the first decoder circuit may include a pre-decoder circuit for the word line and a first level shifter, the first level shifter is coupled to the pre-decoder circuit for the word line and configured to receive a working voltage of the word line, and the first level shifter is configured to output a first signal and a second signal that is equal in magnitude but opposite in sign to the first signal.

Further, in the programming verification control circuit, the first drive circuit may include:

a first pMOS transistor, having a gate for receiving the second signal, a source is coupled to the first voltage and a drain is coupled to the word line of the first memory bit;

a first nMOS transistor, having a gate for receiving the second signal, a source is coupled to a low voltage and a drain is coupled to the word line of the first memory bit; and a second nMOS transistor, having a gate for receiving the first signal, a source is coupled to the first voltage and a drain is coupled to the word line of the first memory bit.

Further, in the programming verification control circuit, the second decoder circuit may include a pre-decoder circuit for the first control gate and a second level shifter, the second level shifter is coupled to the pre-decoder circuit for the first control gate and configured to receive a working voltage of the first control gate, and the second level shifter is configured to output a third signal and a fourth signal that is equal in magnitude but opposite in sign to the third signal.

Further, in the programming verification control circuit, the second drive circuit may include:

a second pMOS transistor, having a gate for receiving the fourth signal, a source is coupled to the second voltage and a drain is coupled to the first control gate of the first memory bit;

a third nMOS transistor, having a gate for receiving the fourth signal, a source is coupled to the low voltage and a drain is coupled to the first control gate of the first memory bit; and a fourth nMOS transistor, having a gate for receiving the third signal, a source is coupled to the second voltage and a drain is coupled to the first control gate of the first memory bit.

Further, in the programming verification control circuit, the voltage equalizer may include:

a first equalizing level shifter for receiving the first enable signal and outputting a second enable signal, the first equalizing level shifter is coupled to the first voltage;

a first equalizing pMOS transistor, having a gate for receiving the second enable signal and a source coupled to the first voltage;

a second equalizing level shifter for receiving the first enable signal and outputting a third enable signal, the first equalizing level shifter is coupled to the second voltage; and a second equalizing pMOS transistor, having a gate for receiving the third enable signal, a source is coupled to the second voltage and a drain is coupled to a drain of the first equalizing pMOS transistor.

Further, in the programming verification control circuit, the memory cell may further include a second memory bit, with the programming verification control circuit further including:

a third decoder circuit for decoding a second control gate of the second memory bit; and a third drive circuit for receiving a third voltage and providing the third voltage to the second control gate of the second memory bit based on a decoding result of the third decoder circuit.

Further, in the programming verification control circuit, the third decoder circuit may include a pre-decoder circuit for the second control gate and a third level shifter, the third level shifter is coupled to the pre-decoder circuit for the second control gate and configured to receive a working voltage of the second control gate, the third level shifter is configured to output a fifth signal and a sixth signal that is equal in magnitude but opposite in sign to the fifth signal.

Further, in the programming verification control circuit, the third drive circuit may include:

a third pMOS transistor, having a gate for receiving the sixth signal, a source is coupled to the third voltage and a drain is coupled to the second control gate of the second memory bit;

a fifth nMOS transistor, having a gate for receiving the sixth signal, a source is coupled to the low voltage and a drain is coupled to the second control gate of the second memory bit; and a sixth nMOS transistor, having a gate for receiving the fifth signal, a source is coupled to the third voltage and a drain is coupled to the second control gate of the second memory bit.

According to a second aspect of the present invention, there is also provided a method for controlling a programming verification control circuit as defined above. The method includes, in a programming cycle of the first memory bit:

controlling the first enable signal to be invalid, thereby performing a programming operation on the first memory bit;

controlling the first enable signal to be valid, thereby the voltage equalizer controlling the first voltage and the second voltage to be conducted; and controlling the first enable signal to be invalid, thereby performing a programming verification operation on the first memory bit.

Further, in the method, between different programming cycles of the first memory bit, the first enable signal may be controlled to be valid, thereby the voltage equalizer controlling the first voltage and the second voltage to be conducted.

Programming verification control circuits and method for control thereof according to the present invention are advantageous over the conventional designs in that a first voltage that is provided to a word line of a memory bit and a second voltage that is provided to a control gate of the memory bit are controlled by a voltage equalizer to be conducted in the event of a first enable signal being valid, thereby equalizing the voltages at the control gate and the word line and allowing a high voltage to drop to an intermediate level without any other voltage being introduced. This can prevent the occurrence of latch-up and accelerate discharge of the high voltage. As a result, the needed programming verification time and energy loss can be reduced.

DETAILED DESCRIPTION

Figure 1:
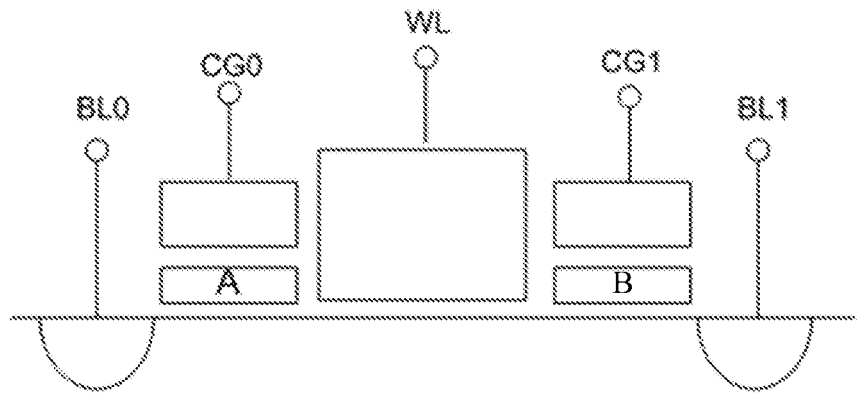
FIG. 1 is a schematic illustration of a memory cell of a conventional flash memory device.

Programming verification control circuits and methods for control thereof according to the present invention will be described in greater detail in the following description which presents preferred embodiments of the invention, in conjunction with the accompanying drawing. It is to be appreciated that those of skill in the art can make changes in the invention disclosed herein while still obtaining the beneficial results thereof. Therefore, the following description shall be construed as being intended to be widely known by those skilled in the art rather than as limiting the invention.

For simplicity and clarity of illustration, not all features of the specific embodiments are described. Additionally, descriptions and details of well-known functions and structures are omitted to avoid unnecessarily obscuring the invention. The development of any specific embodiment of the present invention includes specific decisions made to achieve the developer's specific goals, such as compliance with system related and business related constraints, which will vary from one implementation to another. Moreover, such a development effort might be complex and time-consuming but would nevertheless be a routine undertaking for those of ordinary skill in the art.

The present invention will be further described in the following paragraphs by way of example with reference to the accompanying drawing. Features and advantages of the invention will be more apparent from the following detailed description, and from the appended claims. Note that the accompanying drawing is provided in a very simplified form not necessarily presented to scale, with the only intention of facilitating convenience and clarity in explaining a few exemplary embodiments of the invention.

The core concept of the present invention is to provide a programming verification control circuit for control of a programming verification sequence for a memory bit of a memory cell. The programming verification control circuit includes: a first decoder circuit for decoding a word line of the memory bit; a first drive circuit for receiving a first voltage and providing the first voltage to the word line of the memory bit based on a decoding result of the first decoder circuit; a second decoder circuit for decoding a control gate of the memory bit; a second drive circuit for receiving a second voltage and providing the second voltage to the control gate of the memory bit based on a decoding result of the second decoder circuit; and a voltage equalizer for receiving the first voltage, the second voltage and a first enable signal and, in the event of the first enable signal being valid, performing such control that the first voltage and the second voltage are both conducted, thereby equalizing the voltages at the control gate and the word line and allowing a high voltage to drop to an intermediate level without any other voltage being introduced. This can prevent the occurrence of latch-up and accelerate discharge of the high voltage. As a result, the needed programming verification time and energy loss can be reduced.

Figure 2:
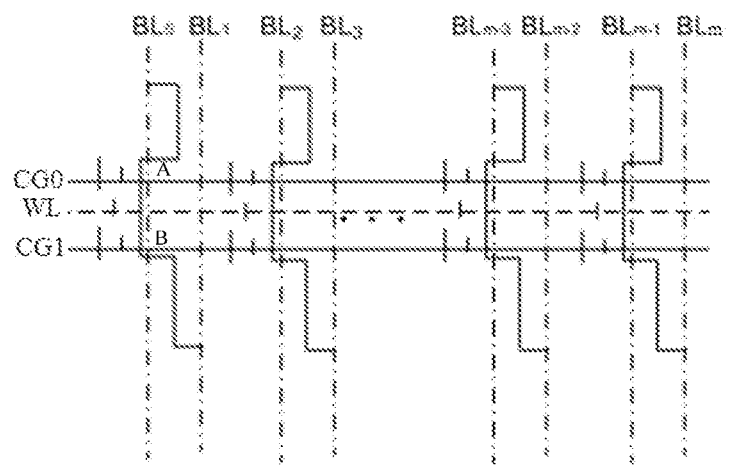
FIG. 2 schematically illustrates an array of memory cells of the conventional flash memory device.
Figure 3:
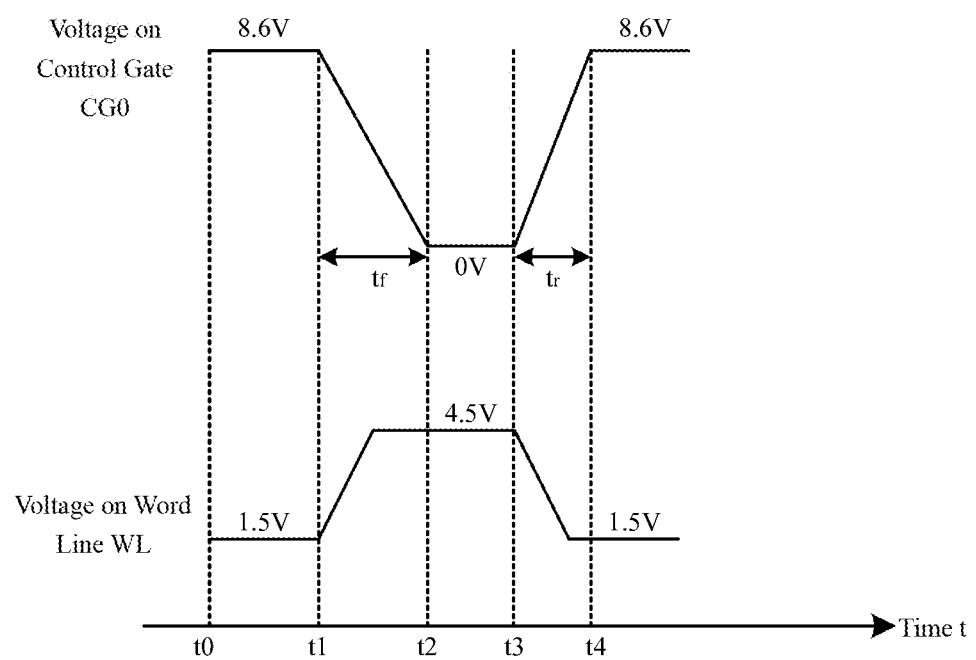
FIG. 3 schematically illustrates variation of voltages at conventional control gate and word line.

Reference is made to FIGS. 4 to 11 below to describe in detail programming verification control circuits and methods for control thereof according to embodiments of the present invention. The circuits and methods are for controlling a programming verification sequence for a memory bit of a memory cell. The embodiments are described with the memory bit implemented as, for example, that shown in FIGS. 1 and 2. The memory cell includes two memory bits, i.e., a memory bit A and a memory bit B. While the embodiments are described in context of the programming of the memory bit A as an example, it is to be understood by those skilled in the art that the memory bit B can be programmed and verified for the programming in the same manner as done to the memory bit A, and a detailed description thereof is therefore omitted herein.

Figure 4:
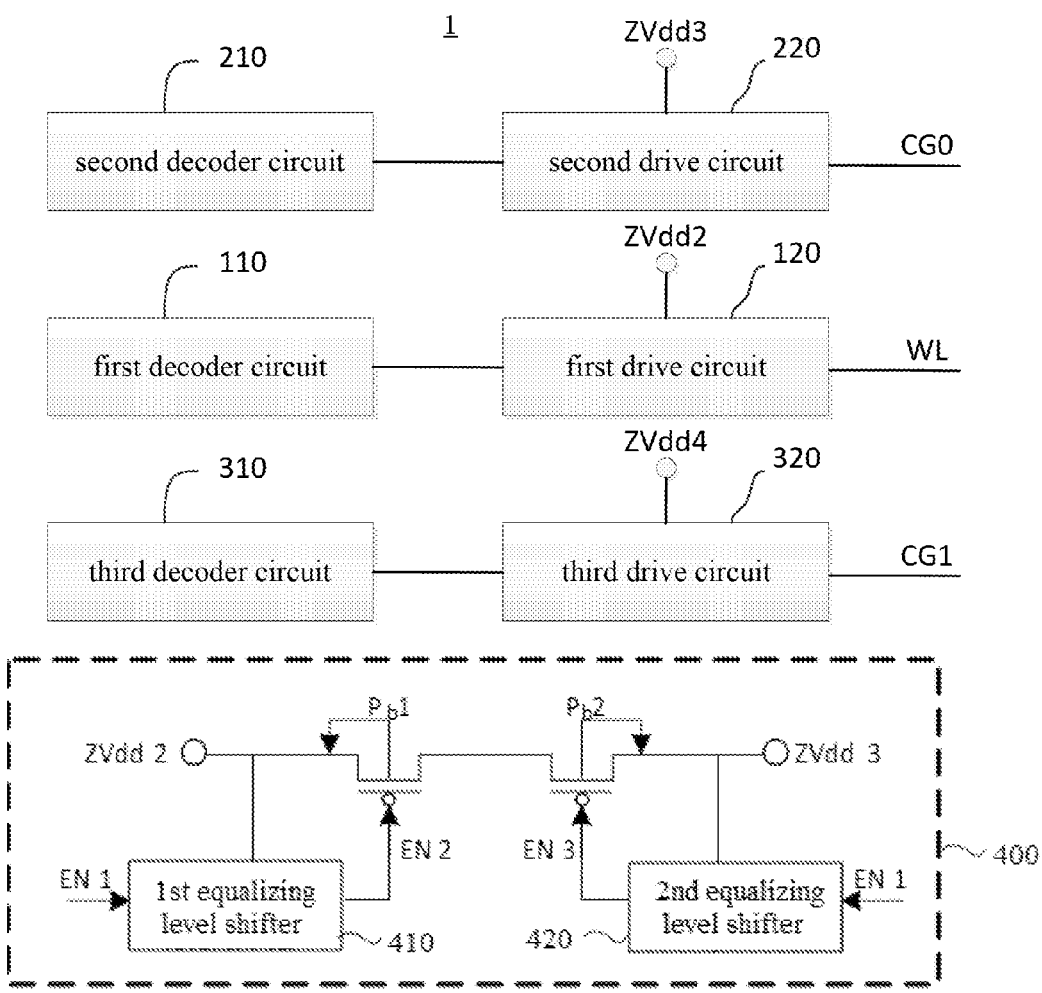
FIG. 4 is a schematic illustration of a programming verification control circuit according to an embodiment of the present invention.

FIG. 4 shows a programming verification control circuit 1, including a first decoder circuit 110, a first drive circuit 120, a second decoder circuit 210, a second drive circuit 220 and a voltage equalizer 400. The first decoder circuit 110 is configured to decode a word line WL of the memory bit A. The first drive circuit 120 is configured to receive a first voltage ZVdd2 and provide the first voltage ZVdd2 to the word line WL of the memory bit A based on a decoding result of the first decoder circuit 110. The first voltage ZVdd2 is applied on the word line WL, as required by a programming or programming verification operation to be performed on the memory bit A. The second decoder circuit 210 is configured to decode the control gate CG0 of the memory bit A, and the second drive circuit 220 is configured to receive a second voltage ZVdd3 and provide the second voltage ZVdd3 to the control gate CG0 of the memory bit A based on a decoding result of the second decoder circuit 210. The second voltage ZVdd3 is applied on the control gate CG0, as also required by the programming or programming verification operation performed on the memory bit A. The voltage equalizer 400 is configured to receive the first voltage ZVdd2, the second voltage ZVdd3 and a first enable signal EN1 and, in the event of the first enable signal EN1 being valid, performing such control that the first voltage ZVdd2 and the second voltage ZVdd3 are both conducted.

Figure 5:
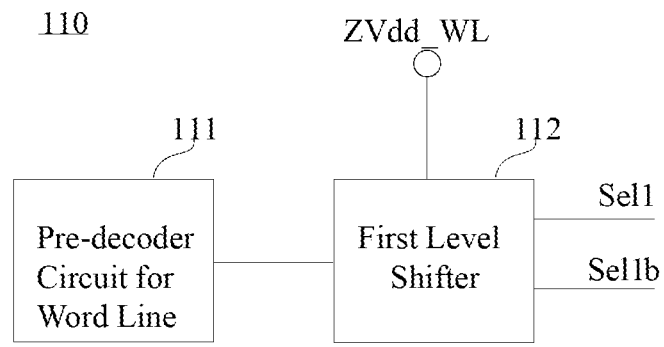
FIG. 5 is a schematic diagram of a first decoder circuit according to an embodiment of the present invention.

Preferably, as shown in FIG. 5, the first decoder circuit 110 includes a pre-decoder circuit 111 for the word line and a first level shifter 112. Additionally, the first level shifter 112 is coupled to the pre-decoder circuit 11 and configured to receive a working voltage ZVdd_WL of the word line. Moreover, the first level shifter 112 is configured to output a first signal Sel1 and a signal Sel1b that is equal in magnitude but opposite in sign to the first signal Sel1. The pre-decoder circuit 111 for the word line may be implemented as a commonly-used decoder circuit, and the first level shifter 112 may be implemented as a commonly-used level shifter. Circuit structures of the pre-decoder circuit 111 and the first level shifter 112 are understandable by those of ordinary skill in the art, and a detailed description thereof is therefore omitted herein. The first decoder circuit 110 is not limited to the structure shown in FIG. 5, as it may have any structure as long as it is capable of decoding the word line WL of the memory bit A, and this is also within the scope of the present invention.

Figure 6:
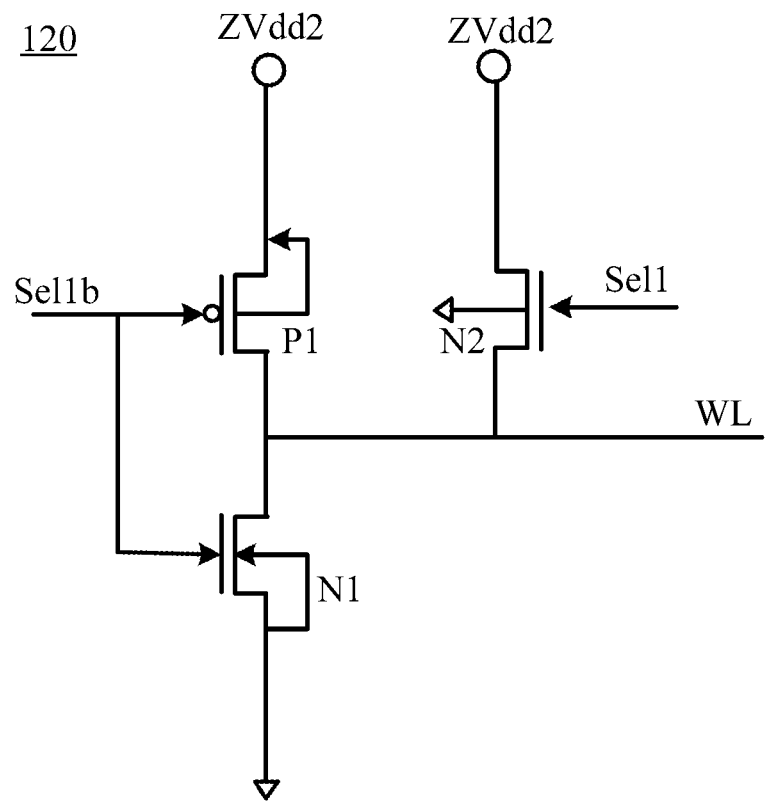
FIG. 6 is a schematic of a first drive circuit according to an embodiment of the present invention.

In one embodiment, as shown in FIG. 6, the first drive circuit 120 includes: a first pMOS transistor P1, a first nMOS transistor N1 and a second nMOS transistor N2. The first pMOS transistor P1 has a gate for receiving the signal Sel1b that is equal in magnitude but opposite in sign to the first signal Sel1, a source coupled to the first voltage ZVdd2 and a drain coupled to the word line WL of the memory bit A. The first nMOS transistor N1 has a gate for receiving the signal Sel1b that is equal in magnitude but opposite in sign to the first signal Sel1, a source coupled to a low voltage (grounded in this embodiment) and a drain coupled to the word line WL of the memory bit A. The second nMOS transistor N2 has a gate for receiving the first signal Sel1, a source coupled to the first voltage ZVdd2, a drain coupled to the word line WL of the memory bit A and a substrate that is grounded. The first drive circuit 120 is not limited to the structure shown in FIG. 6, as it may have any structure as long as it is capable of providing the first voltage ZVdd2 to the word line WL of the memory bit A based on the decoding result of the first decoder circuit 110, and this is also within the scope of the present invention.

Figure 7:
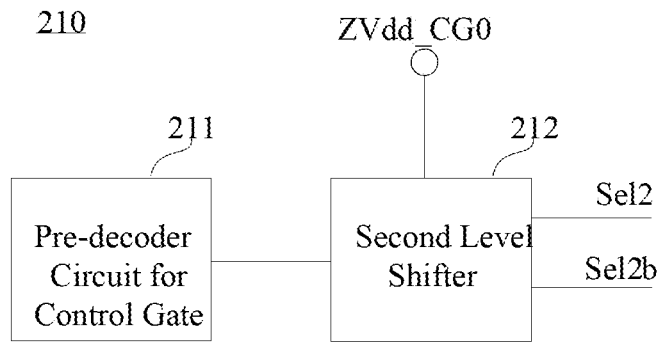
FIG. 7 is a schematic of a second decoder circuit according to an embodiment of the present invention.

Preferably, as shown in FIG. 7, the second decoder circuit 210 includes a pre-decoder circuit 211 for the control gate and a second level shifter 212.

Additionally, the second level shifter 212 is coupled to the pre-decoder circuit 211 and configured to receive a working voltage ZVdd_CG0 of the control gate. Moreover, the second level shifter 212 is configured to output a second signal Sel2 and a signal Sel2b that is equal in magnitude but opposite in sign to the second signal Sel2. The pre-decoder circuit 211 may be implemented as a commonly-used decoder circuit, and the second level shifter 212 may be implemented as a commonly-used level shifter. Circuit structures of the pre-decoder circuit 211 and the second level shifter 212 are understandable by those of ordinary skill in the art, and a detailed description thereof is therefore omitted herein. The second decoder circuit 210 is not limited to the structure shown in FIG. 7, as it may have any structure as long as it is capable of decoding the control gate CG0 of the memory bit A, and this is also within the scope of the present invention.

Figure 8:
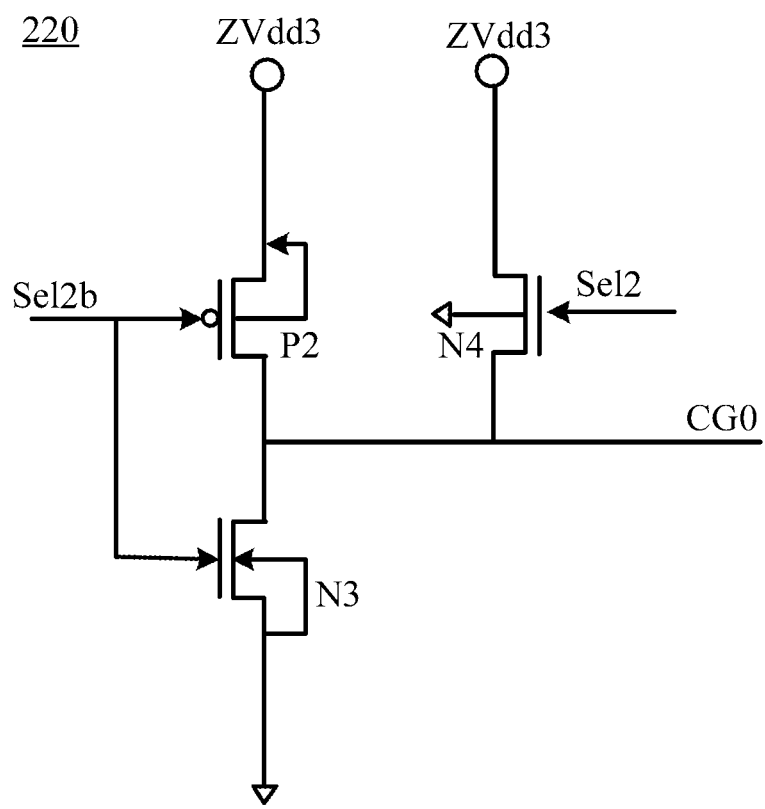
FIG. 8 is a schematic of a second drive circuit according to an embodiment of the present invention.

In one embodiment, as shown in FIG. 8, the second drive circuit 220 includes: a second pMOS transistor P2, a third nMOS transistor N3 and a fourth nMOS transistor N4. The second pMOS transistor P2 has a gate for receiving the signal Sel2b that is equal in magnitude but opposite in sign to the second signal Sel2, a source coupled to the second voltage ZVdd3 and a drain coupled to the control gate CG0 of the memory bit A. The third nMOS transistor N3 has a gate for receiving the signal Sel2b that is equal in magnitude but opposite in sign to the second signal Sel2, a source coupled to a low voltage (grounded in this embodiment) and a drain coupled to the control gate CG0 of the memory bit A. The fourth nMOS transistor N4 has a gate for receiving the second signal Sel2, a source coupled to the second voltage ZVdd3, a drain coupled to the control gate CG0 of the memory bit A and a substrate that is grounded. The second drive circuit 220 is not limited to the structure shown in FIG. 8, as it may have any structure as long as it is capable of providing the second voltage ZVdd3 to the control gate CG0 of the memory bit A based on the decoding result of the second decoder circuit 210, and this is also within the scope of the present invention.

Preferably, as shown in FIG. 4, the voltage equalizer 400 includes: a first equalizing level shifter 410, a first equalizing pMOS transistor $P_b1$, a second equalizing level shifter 420 and a second equalizing pMOS transistor $P_b2$. The first equalizing level shifter 410 is configured to receive the first enable signal EN1 and outputting a second enable signal EN2. Additionally, the first equalizing level shifter 410 is coupled to the first voltage ZVdd2. The first equalizing pMOS transistor $P_b1$ has a gate for receiving the second enable signal EN2 and a source coupled to the first voltage ZVdd2. The second equalizing level shifter 420 is configured to receive the first enable signal EN1 and output a third enable signal EN3. Additionally, the second equalizing level shifter 420 is coupled to the second voltage ZVdd3. The second equalizing pMOS transistor $P_b2$ has a gate for receiving the third enable signal EN3, a source coupled to the second voltage ZVdd3 and a drain coupled to a drain of the first equalizing pMOS transistor $P_b1$. The voltage equalizer 400 shown in FIG. 4 can perform such control that the first voltage ZVdd2 and the second voltage ZVdd3 are conducted when the first enable signal EN1 is valid. The voltage equalizer 400 is not limited to the structure shown in FIG. 4, as it may have any structure as long as it is capable of perform such control that the first voltage ZVdd2 and the second voltage ZVdd3 are both conducted in case of the first enable signal EN1 being valid, and this is also within the scope of the present invention.

Preferably, as shown in FIG. 4, the programming verification control circuit 1 further includes a third decoder circuit 310 and a third drive circuit 320. The third decoder circuit 310 is configured to decode a control gate CG of the memory bits B, and the third drive circuit 320 is configured to receive a third voltage ZVdd4 and provide the third voltage ZVdd4 to a control gate CG1 of the memory bits B based on a decoding result of the third decoder circuit 310.

Figure 9:
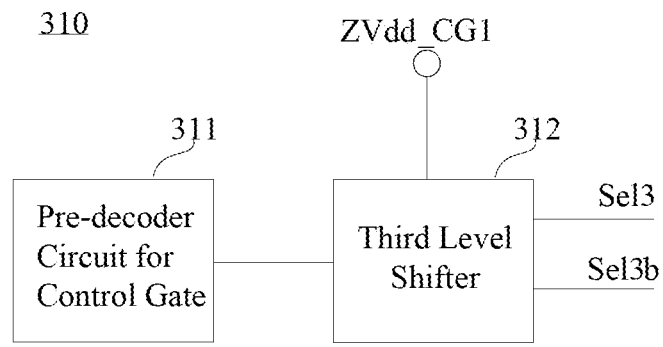
FIG. 9 is a schematic of a third decoder circuit according to an embodiment of the present invention.

In one embodiment, as shown in FIG. 9, the third decoder circuit 310 includes a pre-decoder circuit 311 for the control gate and a third level shifter 312. The third level shifter 312 is coupled to the pre-decoder circuit 311 and configured to receive a working voltage ZVdd_CG1 of the control gate. Moreover, the third level shifter 312 is configured to output a third signal Sel3 and a signal Sel3b that is equal in magnitude, but opposite in sign, to the third signal Sel3. The pre-decoder circuit 311 may be implemented as a commonly-used decoder circuit, and the third level shifter 312 may be implemented as a commonly-used level shifter. Circuit structures of the pre-decoder circuit 311 and the third level shifter 312 are understandable by those of ordinary skill in the art, and a detailed description thereof is therefore omitted herein. The third decoder circuit 310 is not limited to the structure shown in FIG. 9, as it may have any structure as long as it is capable of decoding the control gate CG1 of the memory bit B, and this is also within the scope of the present invention.

Figure 10:
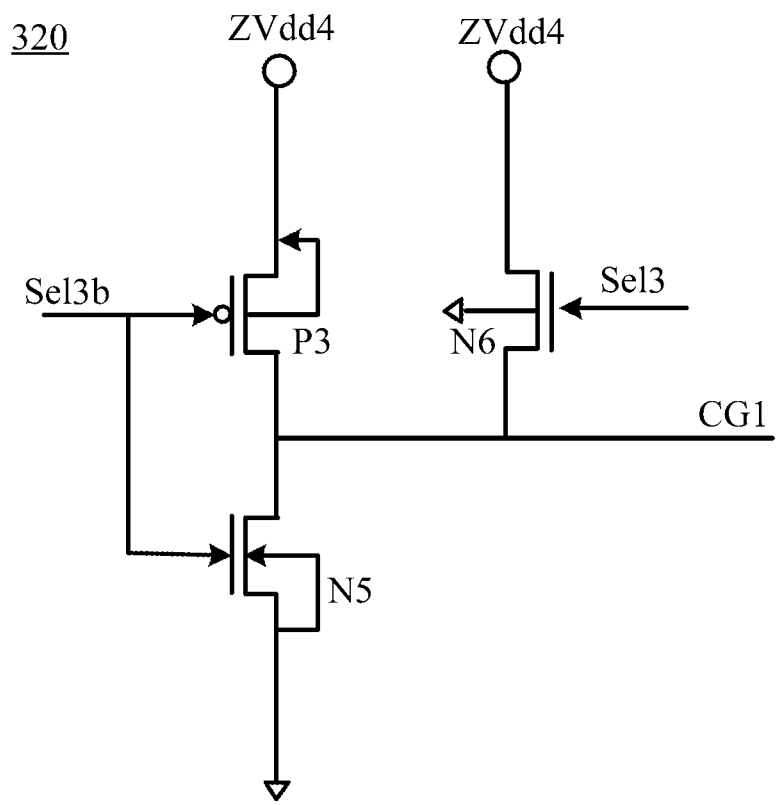
FIG. 10 is a schematic of a third drive circuit according to an embodiment of the present invention.

In one embodiment, as shown in FIG. 10, the third drive circuit 320 includes: a third pMOS transistor P3, a fifth nMOS transistor N5 and a sixth nMOS transistor N6. The third pMOS transistor P3 has a gate for receiving the signal Sel3b that is equal in magnitude but opposite in sign to the third signal Sel3, a source coupled to the third voltage ZVdd4 and a drain coupled to the control gate CG1 of the memory bit B. The fifth nMOS transistor N5 has a gate for receiving the signal Sel3b that is equal in magnitude but opposite in sign to the third signal Sel3, a source coupled to a low voltage (grounded in this embodiment) and a drain coupled to the control gate CG1 of the memory bit B. The sixth nMOS transistor N6 has a gate for receiving the third signal Sel3, a source coupled to the third voltage ZVdd4, a drain coupled to the control gate CG1 of the memory bit B and a substrate that is grounded. The third drive circuit 320 is not limited to the structure shown in FIG. 10, as it may have any structure as long as it is capable of providing the third voltage ZVdd4 to the control gate CG1 of the memory bit B based on the decoding result of the third decoder circuit 310, and this is also within the scope of the present invention.

In general terms, the programming of the memory bit A may be accomplished in many programming cycles. In each of the programming cycles, the memory bit A may be programmed first, followed by the programming verification. Upon the completion of the programming verification, the programming cycle ends, followed by the start of the next programming cycle again for programming of the memory bit A and the programming verification, and so forth.

Figure 11:
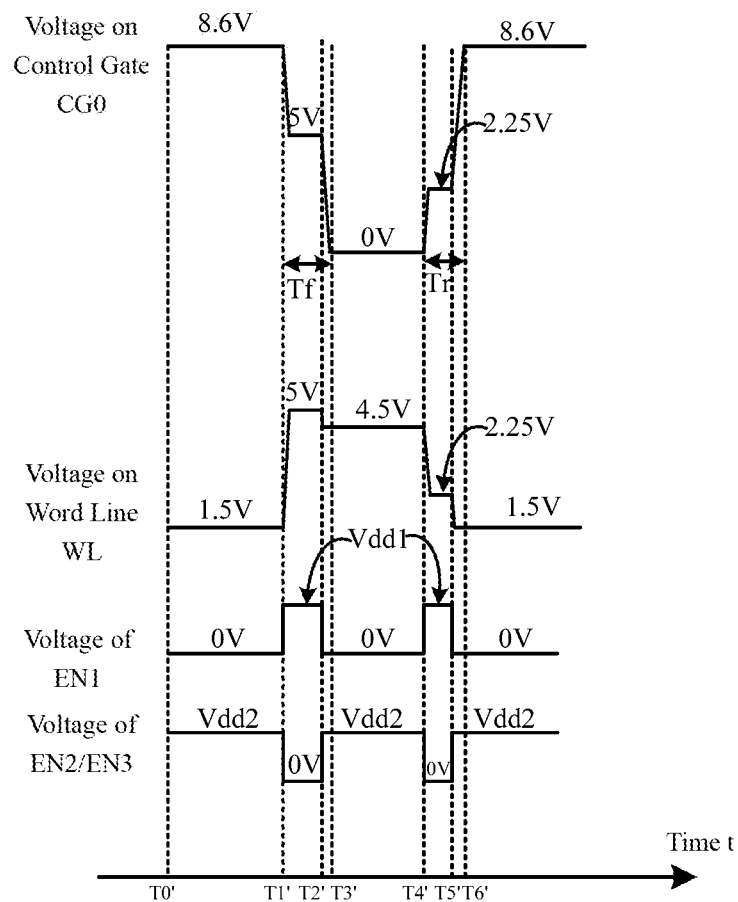
FIG. 11 schematically illustrates variation of voltages at conventional control gate and word line according to an embodiment of the present invention.

During programming verification control of the programming verification control circuit 1 over the memory bit A, in any one of the programming cycle for the memory bit A:

a step S1 is carried out first to program the memory bit A at an instant T0', concurrently with the working voltage ZVdd_CG0 of the control gate CG0 and the working voltage ZVdd_CG1 of the other control gate CG1 both in the range of 6-10 V such as, for example, 8.6 V, the second voltage ZVdd3 also in the range of 6-10 V such as, for example, 8.6 V, the first voltage ZVdd2 in the range of 1-2 V such as, for example, 1.5 V, and the third voltage ZVdd4 in the range of 3-7 V such as, for example, 5 V. As such, as shown in FIG. 11, the voltage at the word line WL of the memory bit A is 1.5 V, with the voltage at the control gate CG0 of the memory bit A at 8.6 V and the voltage at the control gate CG1 of the memory bit B at 4.5 V. The first enable signal EN1 is then so controlled as to be invalid (e.g., having a voltage level of 0 V), and the first equalizing level shifter 410 and the second equalizing level shifter 420 control the second enable signal EN2 and the third enable signal EN3 to be valid (e.g., having a voltage level of Vdd2) respectively. As a result, the source and drain of each of the first equalizing pMOS transistor $P_b1$ and the second equalizing pMOS transistor $P_b2$ are not conducted. Therefore, neither of the first voltage ZVdd2 and the second voltage ZVdd3 is conducted.

A step S2 is then performed to end the programming of the memory bit A at an instant T1'. The first enable signal EN1 is then controlled to be valid (e.g., having a voltage level of Vdd1), and the first equalizing level shifter 410 and the second equalizing level shifter 420 respectively control the second enable signal EN2 and the third enable signal EN3 to be invalid (e.g., having a voltage level of 0 V). As a result, the source and drain of each of the first equalizing pMOS transistor $P_b1$ and the second equalizing pMOS transistor $P_b2$ are conducted, and the first voltage ZVdd2 and the second voltage ZVdd3 are both conducted and mutually equalized (i.e., the first voltage ZVdd2 and the second voltage ZVdd3 are averaged). Therefore, the first voltage ZVdd2 and the second voltage ZVdd3 both become (8.6 V+1.5 V)/2≈5 V. Accordingly, the voltage at the word line WL of the memory bit A becomes 5 V, and the voltage at the control gate CG0 of the memory bit A becomes 5 V too. During this process, the change of the voltage at the word line WL of the memory bit A from 1.5 V to 5 V is rapid, and the discharge of the voltage at the control gate CG0 of the memory bit A from 8.6 V to 5 V is also rapid and not associated with the occurrence of latch-up.

Thereafter, a step S3 is performed to verify the programming of the memory bit A at an instant T2', concurrent with the working voltage ZVdd_CG0 of the control gate and the working voltage ZVdd_CG1 of the other control gate both in the range of 6-10 V such as, for example, 8.6 V, the second voltage ZVdd3 at 0 V, the first voltage ZVdd2 in the range of 3-7 V such as, for example, 4.5 V, and the third voltage ZVdd4 also in the range of 3-7 V such as, for example, 5 V. The first enable signal EN1 is then controlled to be invalid (e.g., having a voltage level of 0 V), and the first equalizing level shifter 410 and the second equalizing level shifter 420 respectively control the second enable signal EN2 and the third enable signal EN3 to be valid (e.g., having a voltage level of Vdd2). As a result, the source and drain of each of the first equalizing pMOS transistor $P_b1$ and the second equalizing pMOS transistor $P_b2$ are not conducted. Therefore, neither of the first voltage ZVdd2 and the second voltage ZVdd3 is conducted. As such, as shown in FIG. 11, at an instant T3', the voltage at the word line WL of the memory bit A decreases from 5 V to 4.5 V, with the voltage at the control gate CG0 of the memory bit A decreasing from 5 V to 0 V and with the voltage at the control gate CG1 of the memory bit B at 4.5 V. The discharge of the voltage at the word line WL of the memory bit A from 5 V to 4.5 V is rapid and not associated with the occurrence of latch-up. Similarly, the discharge of the voltage at the control gate CG0 of the memory bit A from 5 V to 0 V is also rapid and not associated with the occurrence of latch-up.

According to this embodiment, the involvement of latch-up and other effects is avoided, and the decrease of the voltage at the control gate CG0 of the memory bit A to 0 V at the instant T3' only takes a very short period of time $T_f$. This leads to a great reduction in the needed programming verification time.

The programming verification ends at an instant T4', and at the same time, there begins the next programming cycle. Preferably, between different programming cycles of the memory bit A, the first enable signal EN1 is controlled to be valid, thereby allowing the voltage equalizer 400 to control the first voltage and the second voltage to be conducted.

Specifically, at the instant T4', the first enable signal EN1 is controlled to be valid (e.g., having a voltage level of Vdd1), and the first equalizing level shifter 410 and the second equalizing level shifter 420 thereby respectively control the second enable signal EN2 and the third enable signal EN3 to be invalid (e.g., having a voltage level of 0 V). As a result, the source and drain of each of the first equalizing pMOS transistor $P_b1$ and the second equalizing pMOS transistor $P_b2$ are conducted, and the first voltage ZVdd2 and the second voltage ZVdd3 are both conducted and mutually equalized (i.e., the first voltage ZVdd2 and the second voltage ZVdd3 are averaged). Therefore, the first voltage ZVdd2 and the second voltage ZVdd3 both become (4.5 V+0 V)/2≈2.25 V. Accordingly, the voltage at the word line WL of the memory bit A becomes 2.25 V, and the voltage at the control gate CG0 of the memory bit A becomes 2.25 V too. During this process, the change of the voltage at the word line WL of the memory bit A from 4.5 V to 2.25 V is rapid, and the change of the voltage at the control gate CG0 of the memory bit A from 0 V to 2.25 V is also rapid.

At an instant T5', the memory bit A is programmed, concurrently with the working voltage ZVdd_CG0 of the control gate and the working voltage ZVdd_CG1 of the other control gate both in the range of 6-10 V such as, for example, 8.6 V, the second voltage ZVdd3 also in the range of 6-10 V such as, for example, 8.6 V, the first voltage ZVdd2 in the range of 1-2 V such as, for example, 1.5 V, and the third voltage ZVdd4 in the range of 3-7 V such as, for example, 5 V. The first enable signal EN1 is then controlled to be invalid (e.g., having a voltage level of 0 V), and the first equalizing level shifter 410 and the second equalizing level shifter 420 thereby respectively control the second enable signal EN2 and the third enable signal EN3 to be valid (e.g., having a voltage level of Vdd2). As a result, the source and drain of each of the first equalizing pMOS transistor $P_b1$ and the second equalizing pMOS transistor $P_b2$ are not conducted. Therefore, neither of the first voltage ZVdd2 and the second voltage ZVdd3 is conducted. As such, as shown in FIG. 11, at an instant T6', the voltage at the word line WL of the memory bit A decreases from 2.25 V to 1.5 V, with the voltage at the control gate CG0 of the memory bit A rising from 2.25 V to 8.6 V and with the voltage at the control gate CG1 of the memory bit B at 4.5 V.

According to this embodiment, the involvement of latch-up and other effects is avoided, and the decrease of the voltage at the word line WL of the memory bit A from 2.25 V to 1.5 V is rapid and only takes a very short period of time $T_r$. At the same time, the change of the voltage at the control gate CG0 of the memory bit A from 2.25 V to 8.6 V is also rapid. This is conducive to the acceleration of the overall programming process of the memory bit A.

Obviously, those skilled in the art may make various modifications and alterations without departing from the spirit and scope of the invention. It is therefore intended that the invention be construed as including all such modifications and alterations insofar as they fall within the scope of the appended claims or equivalents thereof.

What is claimed is:

1. A programming verification control circuit for controlling a programming verification sequence for a first memory bit of a memory cell, the programming verification control circuit comprising:
   a first decoder circuit for decoding a word line of the first memory bit;
   a first drive circuit for receiving a first voltage and providing the first voltage to the word line of the first memory bit based on a decoding result of the first decoder circuit;
   a second decoder circuit for decoding a first control gate of the first memory bit;
   a second drive circuit for receiving a second voltage and providing the second voltage to the first control gate of the first memory bit based on a decoding result of the second decoder circuit; and
   a voltage equalizer for receiving the first voltage, the second voltage and a first enable signal and, in event of the first enable signal being valid, controlling the first voltage and the second voltage to be conducted,
   wherein the first decoder circuit comprises a pre-decoder circuit for the word line and a first level shifter, the first level shifter coupled to the pre-decoder circuit for the word line and configured to receive a working voltage of the word line, the first level shifter configured to output a first signal and a second signal equal in magnitude but opposite in sign to the first signal.

2. The programming verification control circuit according to claim 1, wherein in event of the first enable signal being invalid, the first memory bit performs a programming/programming verification operation.

3. The programming verification control circuit according to claim 1, wherein the first drive circuit comprises:
   a first pMOS transistor, having a gate for receiving the second signal, a source coupled to the first voltage and a drain coupled to the word line of the first memory bit;
   a first nMOS transistor, having a gate for receiving the second signal, a source coupled to a low voltage and a drain coupled to the word line of the first memory bit; and
   a second nMOS transistor, having a gate for receiving the first signal, a source coupled to the first voltage and a drain coupled to the word line of the first memory bit.

4. The programming verification control circuit according to claim 1, wherein the second decoder circuit comprises a pre-decoder circuit for the first control gate and a second level shifter, the second level shifter coupled to the pre-decoder circuit for the first control gate and configured to receive a working voltage of the first control gate, the second level shifter configured to output a third signal and a fourth signal equal in magnitude but opposite in sign to the third signal.

5. The programming verification control circuit according to claim 4, wherein the second drive circuit comprises:
   a second pMOS transistor, having a gate for receiving the fourth signal, a source coupled to the second voltage and a drain coupled to the first control gate of the first memory bit;
   a third nMOS transistor, having a gate for receiving the fourth signal, a source coupled to the low voltage and a drain coupled to the first control gate of the first memory bit; and
   a fourth nMOS transistor, having a gate for receiving the third signal, a source coupled to the second voltage and a drain coupled to the first control gate of the first memory bit.

6. The programming verification control circuit according to claim 1, wherein the voltage equalizer comprises:
   a first equalizing level shifter for receiving the first enable signal and outputting a second enable signal, the first equalizing level shifter coupled to the first voltage;
   a first equalizing pMOS transistor, having a gate for receiving the second enable signal and a source coupled to the first voltage;
   a second equalizing level shifter for receiving the first enable signal and outputting a third enable signal, the first equalizing level shifter coupled to the second voltage; and
   a second equalizing pMOS transistor, having a gate for receiving the third enable signal, a source coupled to the second voltage and a drain coupled to a drain of the first equalizing pMOS transistor.

7. The programming verification control circuit according to claim 1, wherein the memory cell further comprises a second memory bit, and the programming verification control circuit further comprises:
   a third decoder circuit for decoding a second control gate of the second memory bit; and
   a third drive circuit for receiving a third voltage and providing the third voltage to the second control gate of the second memory bit based on a decoding result of the third decoder circuit.

8. The programming verification control circuit according to claim 7, wherein the third decoder circuit comprises a pre-decoder circuit for the second control gate and a third level shifter, the third level shifter coupled to the pre-decoder circuit for the second control gate and configured to receive a working voltage of the second control gate, the third level shifter configured to output a fifth signal and a sixth signal that is equal in magnitude but opposite in sign to the fifth signal.

9. The programming verification control circuit according to claim 8, wherein the third drive circuit comprises:
   a third pMOS transistor, having a gate for receiving the sixth signal, a source coupled to the third voltage and a drain coupled to the second control gate of the second memory bit;
   a fifth nMOS transistor, having a gate for receiving the sixth signal, a source coupled to the low voltage and a drain coupled to the second control gate of the second memory bit; and
   a sixth nMOS transistor, having a gate for receiving the fifth signal, a source coupled to the third voltage and a drain coupled to the second control gate of the second memory bit.

10. A method for controlling a programming verification control circuit as defined in claim 1, wherein the method comprising, in a programming cycle of the first memory bit:
    controlling the first enable signal to be invalid, thereby performing a programming operation on the first memory bit;
    controlling the first enable signal to be valid, thereby the voltage equalizer controlling the first voltage and the second voltage to be conducted; and
    controlling the first enable signal to be invalid, thereby performing a programming verification operation on the first memory bit.

11. The method according to claim 10, wherein between different programming cycles of the first memory bit, the first enable signal is controlled to be valid, thereby the voltage equalizer controlling the first voltage and the second voltage to be conducted.

* * * * *